(12) United States Patent
Weichart

(10) Patent No.: US 9,719,177 B2
(45) Date of Patent: Aug. 1, 2017

(54) IN-SITU CONDITIONING FOR VACUUM PROCESSING OF POLYMER SUBSTRATES

(75) Inventor: Juergen Weichart, Balzers (LI)

(73) Assignee: EVATEC AG, Trübbach (CH)

( * ) Notice: Subject to any disclaimer, the term of this patent is extended or adjusted under 35 U.S.C. 154(b) by 872 days.

(21) Appl. No.: 13/877,960

(22) PCT Filed: Oct. 3, 2011

(86) PCT No.: PCT/CH2011/000235
§ 371 (c)(1),
(2), (4) Date: May 24, 2013

(87) PCT Pub. No.: WO2012/045187
PCT Pub. Date: Apr. 12, 2012

(65) Prior Publication Data
US 2013/0248358 A1    Sep. 26, 2013

Related U.S. Application Data

(60) Provisional application No. 61/389,833, filed on Oct. 5, 2010.

(51) Int. Cl.
*C23C 14/34*    (2006.01)
*C23F 4/00*    (2006.01)
(Continued)

(52) U.S. Cl.
CPC .............. *C23F 4/00* (2013.01); *C23C 14/50* (2013.01); *C23C 14/541* (2013.01);
(Continued)

(58) Field of Classification Search
CPC ..... C23C 14/50; C23C 14/541; C23C 14/455; C23C 14/45517; C23C 14/463
See application file for complete search history.

(56) References Cited

U.S. PATENT DOCUMENTS 3,811,794 A    5/1974 Dunkleberger
5,443,688 A *  8/1995 Toure ............... H01L 21/31122
                                                    216/13
(Continued)

FOREIGN PATENT DOCUMENTS

CN    1561405 A    1/2005
CN    101270466 A    9/2008
(Continued)

OTHER PUBLICATIONS

International Search Report for PCT/CH2011/000235 dated May 4, 2012.
(Continued)

*Primary Examiner* — Jason M Berman
(74) *Attorney, Agent, or Firm* — Pearne & Gordon LLP

(57) ABSTRACT

An etching chamber is equipped with an actively-cooled element preferentially adsorbs volatile compounds that are evolved from a polymeric layer of a wafer during etching, which compounds will act as contaminants if re-deposited on the wafer, for example on exposed metal contact portions where they may interfere with subsequent deposition of metal contact layers. In desirable embodiments, a getter sublimation pump is also provided in the etching chamber as a source of getter material. Methods of etching in such a chamber are also disclosed.

14 Claims, 9 Drawing Sheets

(51) Int. Cl.
  *C23C 14/54*  (2006.01)
  *C23C 16/455*  (2006.01)
  *C23C 14/50*  (2006.01)
  *C23C 16/46*  (2006.01)
  *H01J 37/32*  (2006.01)

(52) U.S. Cl.
  CPC ...... *C23C 16/455* (2013.01); *C23C 16/45517* (2013.01); *C23C 16/463* (2013.01); *H01J 37/32522* (2013.01); *H01J 37/32871* (2013.01)

(56) References Cited

U.S. PATENT DOCUMENTS

| | | | | |
|---|---|---|---|---|
| 5,938,943 | A * | 8/1999 | Amini | H01J 37/32871 156/345.37 |
| 5,980,213 | A * | 11/1999 | Krueger | C23C 14/54 417/48 |
| 6,214,720 | B1 | 4/2001 | Sill et al. | |
| 2004/0005726 | A1* | 1/2004 | Huang | H01J 37/32642 438/14 |
| 2005/0070105 | A1 | 3/2005 | Bailey | |

FOREIGN PATENT DOCUMENTS

| | | |
|---|---|---|
| EP | 1324374 A2 | 7/2003 |
| EP | 1780777 A1 | 5/2007 |
| JP | 63-291421 A | 11/1988 |

OTHER PUBLICATIONS

Office Action issued in corresponding Chinese Patent Application No. 201180048699.3 dated Mar. 20, 2015.

* cited by examiner

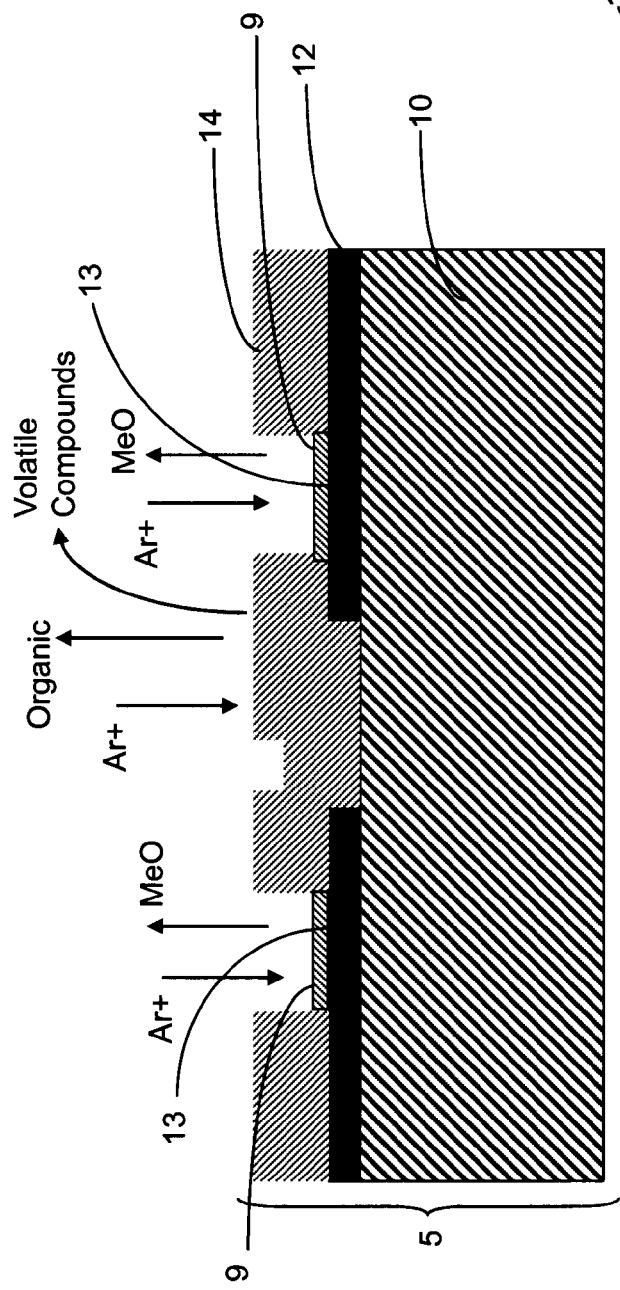
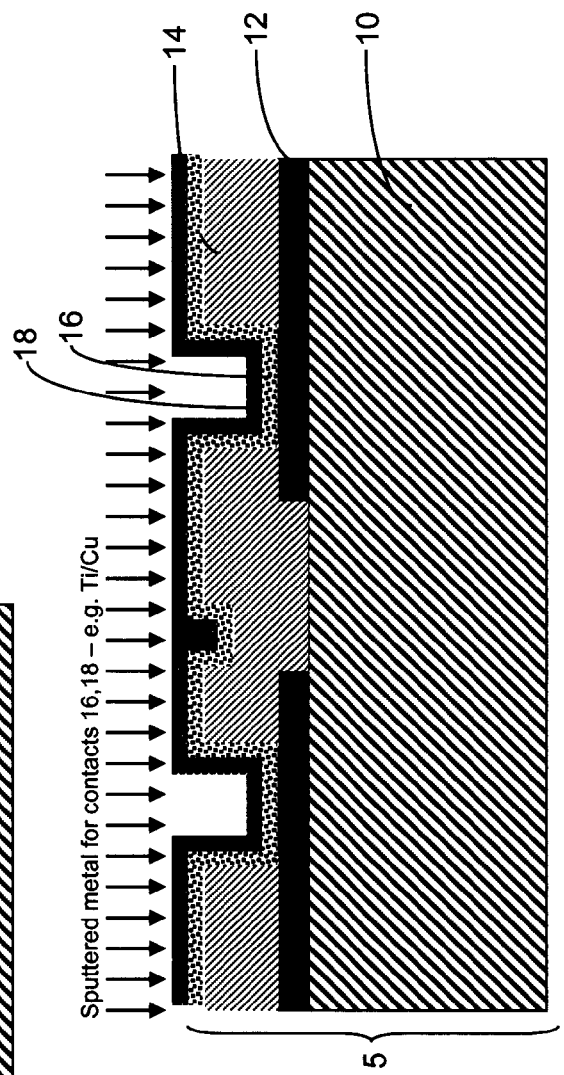

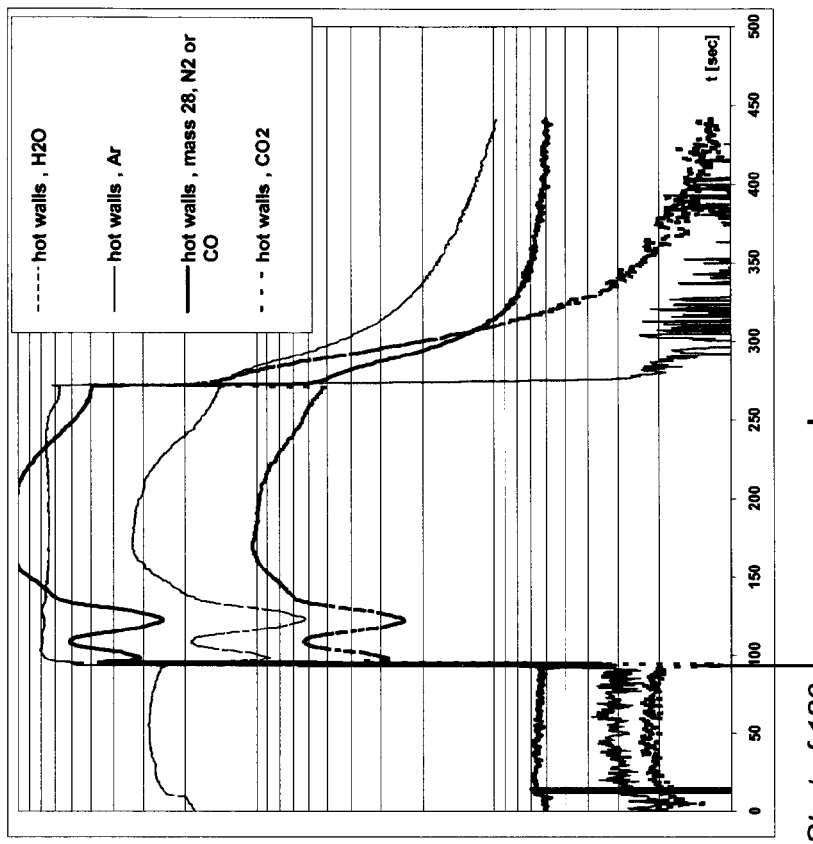
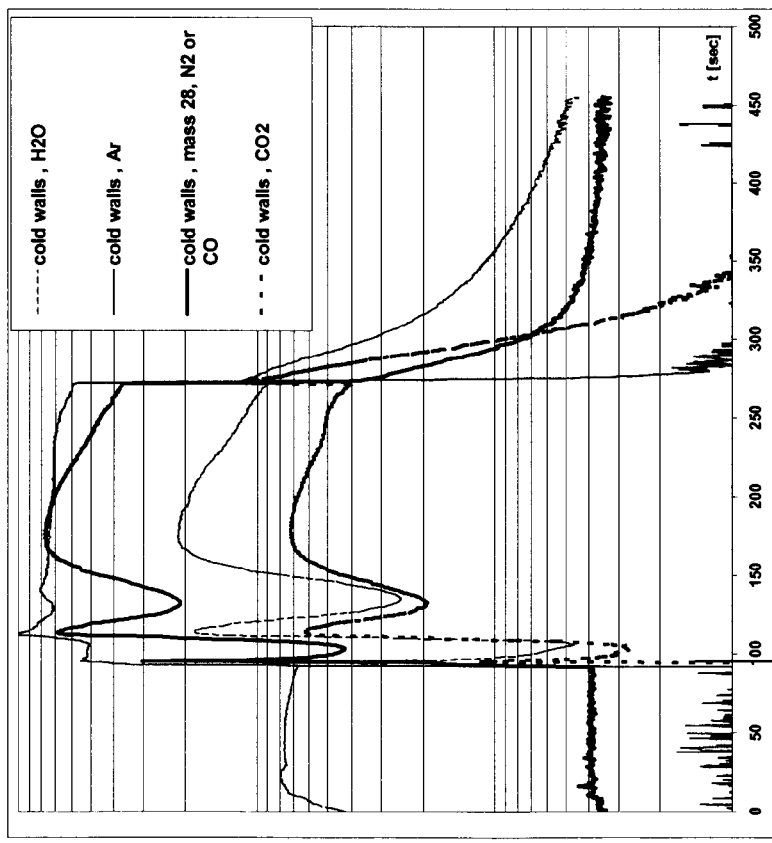
Fig. 7

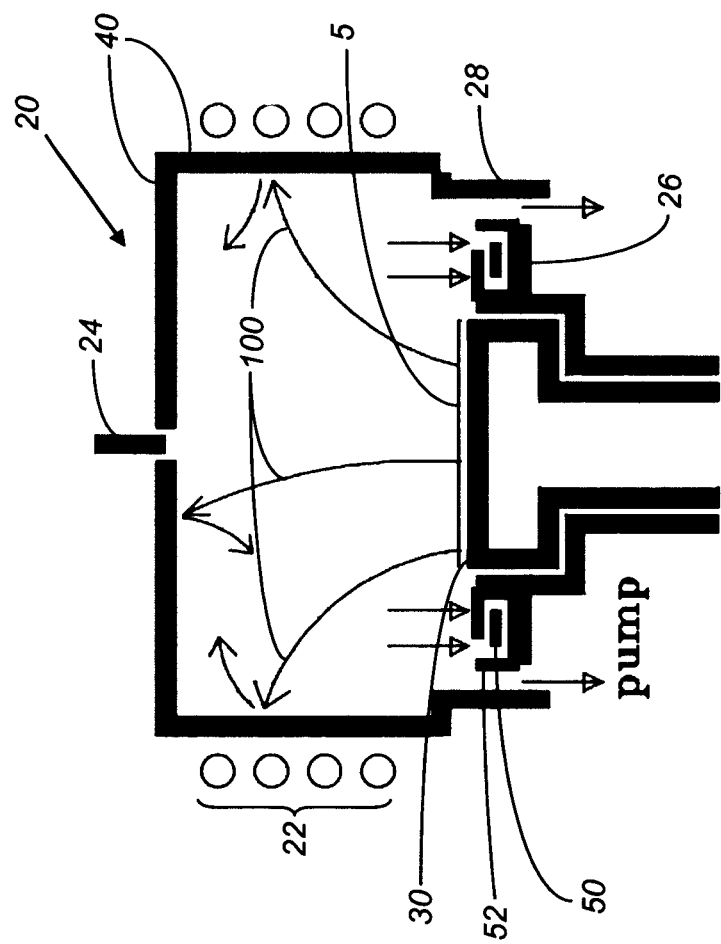

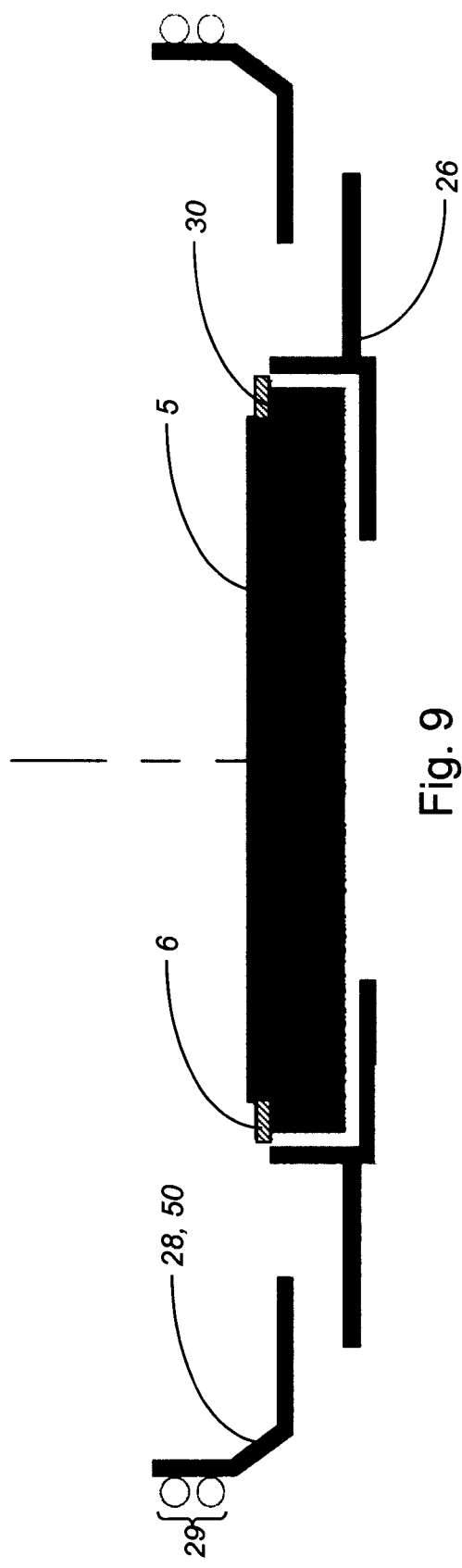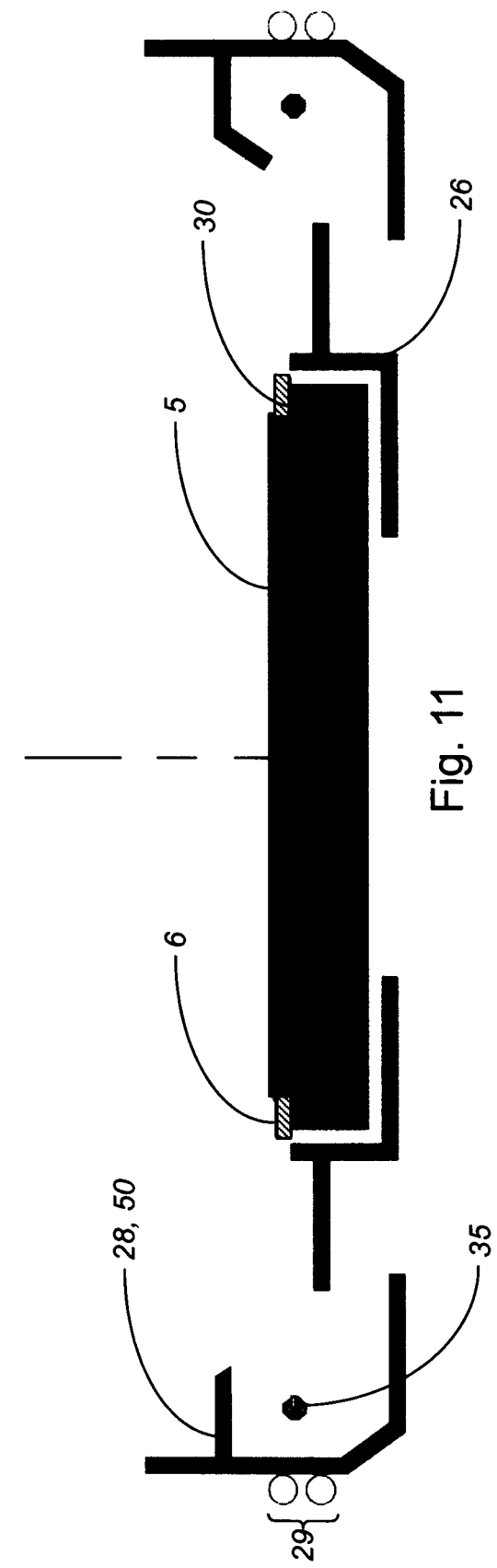

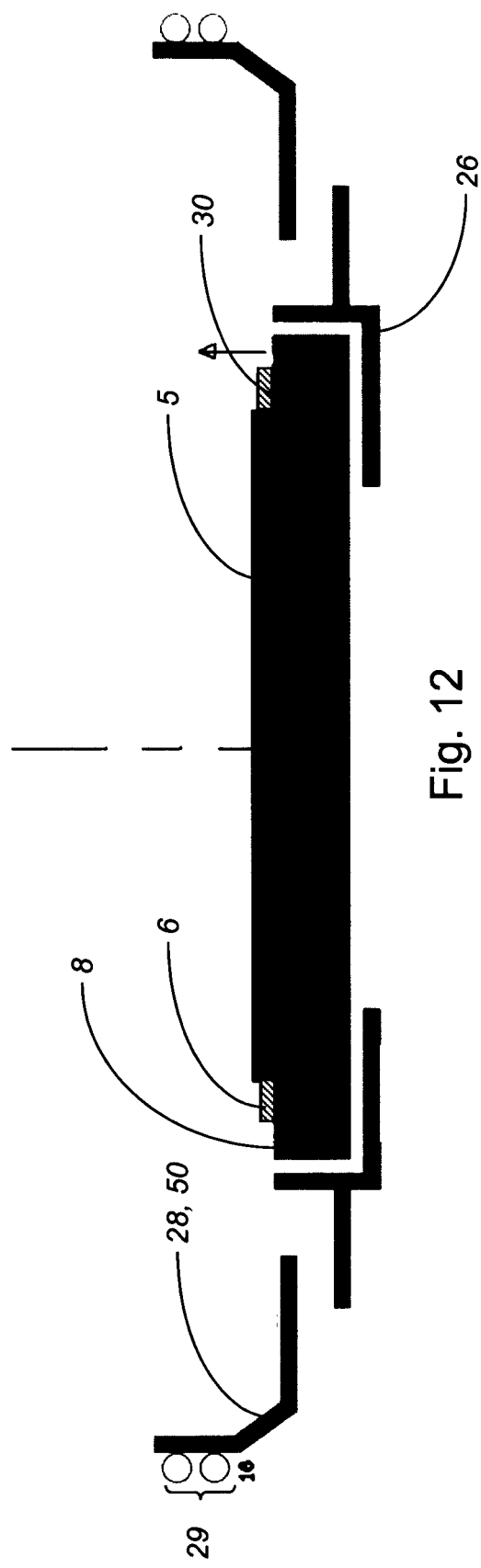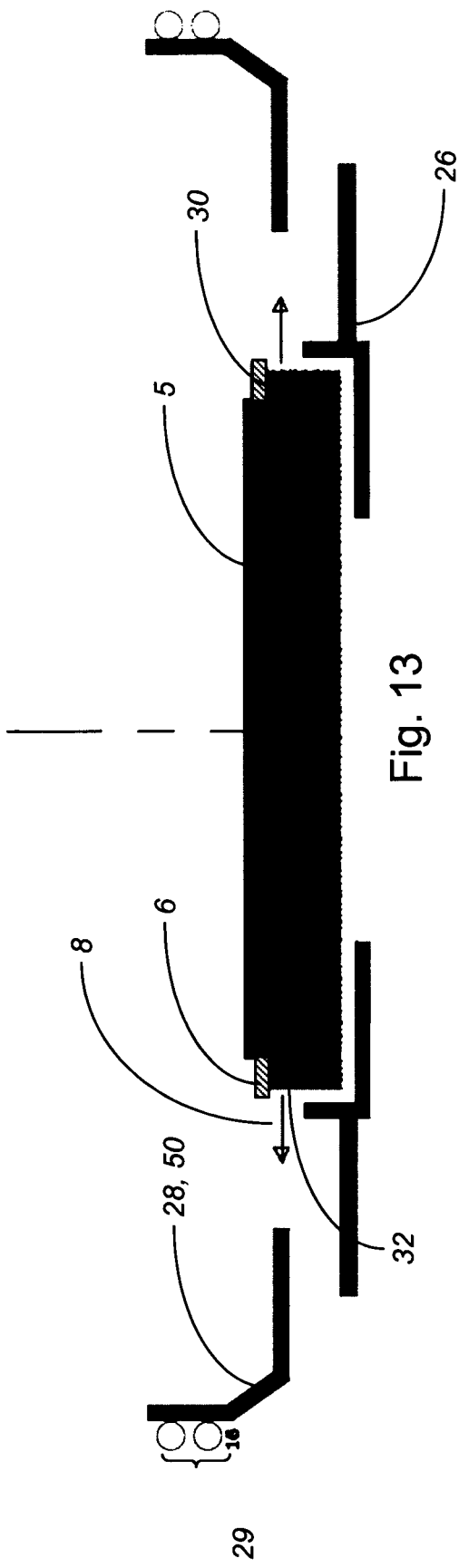

IN-SITU CONDITIONING FOR VACUUM PROCESSING OF POLYMER SUBSTRATES

BACKGROUND

In semiconductor processing, in particular wafer packaging, the use of polymer materials has become very important. The processing of substrates like silicon wafers coated with polyimide (PI) or polybenzobisoxazole (PBO) in vacuum coating tools has become a very common problem due to heavy outgassing of these materials. Even more problematic is the situation with the so called enhanced Wafer Level ball grid array packaging technology (eWLB), where the silicon dice are embedded in a wafer made of polymer resin, also called a fanout wafer.

As part of the wafer packaging process a metallization is performed on patterned wafer 5 such as that depicted in FIG. 1. The wafer 5 shown in FIG. 1 includes a base substrate 10 (e.g. silicon), and metal layer(s) 12 (which may be discontinuous) having exposed contact portions 13. The contact portions 13 of the metal layers are accessible through a superjacent patterned insulating layer 14 composed of organic polymer material (e.g. PI or PBO). The goal is to provide metal contact layers (or contacts) 16 and 18 (seen in FIG. 2) for the contact portions 13 of the metal layers 12. The contacts 16,18 provide a path of electrical conductivity with said layers 12 that remains accessible through the openings in the patterned insulating layer 14. The process proceeds generally in two steps; namely an etching step to remove metal oxide deposits from the contact portions of the metal layers 12, followed by a metallization step to deposit the metal contacts 16,18.

In the first step, illustrated in FIG. 1, sputter etching by a plasma of an inert gas, typically Argon ions (Ar+), is used for the removal of metal oxide (MeO) that has formed on the exposed contact portions 13 of the metal layers 12. The MeO layers 9 are illustrated schematically in FIG. 1 with exaggerated dimensions for ease of observation (except as expressly indicated, no drawing figures in this application are drawn to scale). Removal of such oxides is desirable to maximize the conductivity and adhesion between the metal layer 12 and the later-applied contact layers 16 and 18.

Unfortunately, the plasma etching is not confined to just the metal contact portions 13. Rather, the plasma also etches the organic insulation layer 14, thus accelerating the evolution of volatile compounds (VCs) therefrom and liberating polymer material, as well. These VCs and liberated polymer can contaminate the metal contact portions 13 and interfere with etching them to remove MeO. In the second step, illustrated in FIG. 2, at least one contact layer (two contact layers 16 and 18 are shown in the illustrated embodiment) is applied. The contact layers 16 and 18 can be, e.g., titanium followed by copper. These contact layers 16 and 18 are typically applied via sputtering from an appropriate metal target, e.g. Ti or Cu, not shown in the figure. It is to be appreciated that like the plasma sputtering in the first step, this metal sputtering process also is not specific to only the contact areas 13. Rather, a metal coating will be applied over the entire wafer 5 surface (including the upper surface of the polymeric insulating layer 14) as indicated schematically by the arrows in FIG. 2. This means that the metal layers for contacts 16 and 18 extend beyond the contact portions 13 as-applied, and cover the entire upper surface of the wafer 5 as illustrated in FIG. 2.

Once the metal coating(s) for the contacts 16,18 has/have been deposited the liberation of VCs and organic material from that layer 14 will cease because the metal coating deposited on top of the insulating layer 14 will act as a barrier to the transmission of VCs and other organics. Following deposition of the metal layers for contacts 16, 18, a subsequent photolithography step typically is carried out to separate portions of those layers that will form the desired conductive circuits for the contacts 16,18. The subsequent photolithography step is beyond the scope of the present disclosure.

The foregoing two steps generally are carried out successively in respective etching and sputter chambers. In the first step carried out in the etching chamber, that chamber is initially pumped down to a vacuum and a degassing operation is performed at elevated temperature. The degassing operation is important since a certain degas temperature should not be exceeded to avoid degradation of the polymer insulating layer 14. Otherwise the outgassing is a function of time which cannot be easily accelerated. Long outgassing times however are not wanted since these slow down the throughput. Following degassing, the sputter etch operation using an inert gas plasma (typically argon) is carried out to clean the exposed metal surfaces (contact portions 13) of contaminating MeO. This process is relatively simple but it has the disadvantage that it is not selective and the Ar+ ions etch not only MeO from the exposed contact-portion surface but also polymeric material from the insulating layer 14. The resulting etched polymer often forms a thick deposit of bad integrity on the chamber walls, resulting in particles. In addition, because the etch process introduces heat to the wafer there is an increasing amount of volatile compounds (VC) outgassing from the wafer—mainly water vapour and organic residues from the insulating layer 14—over the etch process time. The evolution of these VCs via outgassing can be seen as a pressure rise in the etching chamber. These VCs leads to the effect that the MeO cannot be properly cleaned from the exposed contact portions of the metal layers due to incorporation of contaminants (i.e. volatile organics). Finally, the etch clean rate of MeO from the metal surfaces is lower than the contamination rate of those surfaces based on VCs outgassed from the insulating layer 14, resulting in a bad contact resistance.

In the second step discussed above, the wafer is moved to a sputter chamber where the metal contact layers 16,18 are applied. In the case of two or more layers, the sputter-metal deposition may be applied in two or more successive sputter chambers, one for each of the applied layers. Because the metal sputtering operation deposits metal over the polymeric insulating layer 14 and the deposited metal acts as a barrier to outgassing, it is primarily outgassing during the first step discussed above (sputtering with Ar+ plasma to remove MeO from the exposed metal contact portions 13), for which problems associated with excessive polymer sputtering and outgassing must be addressed.

Thus, there is a need in the art to improve the etch process in step 1 discussed above to achieve low particle generation from etched polymer material from the insulating layer 14, and to minimize contact resistance at the interfaces between the metal layer(s) 12 and the respective contacts 16,18 as a result of excessive MeO or other contaminants liberated from the insulating layer 14 during the etching process (i.e. polymer particles and VCs).

STATE OF THE ART

FIG. 3 shows a typical setup of an inductively coupled plasma (ICP) etching chamber. In the chamber defined within a dielectric housing 20, a plasma is generated by a coil 22, which couples power to the plasma at a frequency preferably in the range of 300 to 15000 kHz, most preferably of or about 450 kHz. Ar or another ionizable inert gas is fed through the chamber via a gas inlet 24 and the pumping port defined by parts of a shield set (shields 26 and 28). The wafer 5 to be etched in order to remove MeO deposits from the exposed contact portions 13 (see FIG. 1) is put on a support surface of a pedestal 30 where high frequency, e.g. in the range of 1 to 70 MHz, most preferably of or about 13.56 MHz, is applied to attract the plasma ions to the wafer 5 by the build-up of a self bias potential. The pedestal 30 itself extends at least partially within the housing 20 (and therefore within the etching chamber), so that at least its upper surface (the support surface) is fully disposed within that chamber. As a first approach it can be assumed that the chamber is very well conditioned, so that the only source of volatile compounds VC is the wafer 5 (and specifically insulating layer 14—see FIG. 1). If the chamber has cold walls 40 and clean surfaces VC will leave the wafer 5 as soon as the temperature introduced by the etch process increases and these will deposit on the walls 40 as indicated by the arrows 100. This mechanism works sufficiently to minimize contamination for a low thermal load or when effective cooling of the chamber walls 40 can be achieved and maintained. However an effective cooling is not always possible on chamber portions used for coupling of electromagnetic power like the ICP when the coil 22 is located outside the housing 20. To transmit RF radiation efficiently the housing 20 must be made of a dielectric material, such as quartz, which typically has a low conductivity and therefore cannot be cooled evenly or efficiently. Instead, localized chilling of such materials tends to introduce internal stresses from induced temperature gradients that can cause the housing 20 to crack. Separately, from the design and maintenance standpoint it is also often desirable to use parts which are easy and fast to exchange for cleaning. Cooled parts, e.g. coupled to heat-exchange apparatus or containing water-cooling conduits coupled to a source of chilling water, cannot be efficiently swapped out and replaced. This means that under production conditions the walls 40 will heat up, so that the mechanism of adsorbing VC fails after some time in operation. This is indicated in FIG. 4 where the rates of adsorption and desorption are balancing out. At this point, VCs and other organics liberated from the polymeric insulating layer 14 of wafer 5 will accumulate within the chamber.

In FIGS. 5a-d typical residual gas spectra measured within an etching chamber similar to that illustrated in FIGS. 3-4 for a typical etching operation using Ar as the source of plasma. The data in these figures were obtained from a high pressure quadrupole mass analyzer and are plotted in logarithmic scale. From top to bottom: FIG. 5a is a mass spectrum taken within the chamber having no wafer 5 or argon therein, and showing the total base (initial) pressure of $3 \times 10^{-7}$ mbar following pumping down to vacuum (small air leak only); FIG. 5b is a similar mass spectrum after argon was introduced, which is needed for the sputter etch process; FIG. 5c is a further mass spectrum without argon in the chamber but having a wafer 5 therein with an insulating layer 14 (see FIG. 1) made of PI, which shows outgassing from the wafer; and FIG. 5d is a further mass spectrum taken during ICP sputter etching of a PI-coated wafer. It can be seen from these spectra that the main VCs are water (16, 17, 18amu), hydrocarbons (2, 12, 15amu and higher), as well as CO (28amu) and $CO_2$ (44amu). One has to note that the partial pressure of water vapour and other VC is already close to that of the Ar process pressure. This can in some cases even prevent the ignition of the ICP plasma.

The time dependent behaviour of the VC in the ICP process chamber (see in FIGS. 3-4) is given in FIG. 6. As soon as the wafer 5 enters the chamber, the water vapour content increases by 2 orders of magnitude. When Ar is introduced to a relatively high pressure of approx. $8 \times 10^{-4}$ mbar the other gas signals are slightly decreased due a suppression effect. Here the Ar (36amu—Ar isotope 36 has a relative natural fraction of 0.34% and therefore provides a better signal relation to gases in lower concentration) signal is used for better scalability. An etch process of 48 seconds is ignited showing that after a few seconds already a strong increase of the signals for $CO_2$ (44amu) and CO (28amu) is observed. For $O_2$ (32amu) and $H_2O$ (18amu) for the first seconds a decrease is observed which can be attributed to oxygen consumption due to the reaction of polymer constituents into $CO_2$ and CO. Then after approx. 5 seconds all signals are increasing due to temperature rise and outgassing of the PI coated wafer. These signals fall again after less than 20 seconds.

For a more extended etch time of 180 seconds as seen in FIG. 7, a second peak of desorption can be observed after approx. 80 seconds. The first desorption peak is weaker and shorter and can be interpreted as surface desorption while the second peak is stronger and wider and may be interpreted as bulk desorption from the polymer. In FIG. 7 two situations are given and adjusted to the same time scale, the signal traces for a cold etching chamber of approx. 30° C. wall temperature (FIG. 7a) and those of a hot etching chamber of approx. 120° C. wall temperature (FIG. 7b). As can be easily seen all signals are higher for the hot walls due to the reduced adsorption capability of the walls. At the same time the Ar signal is constant. It can also be seen that the pump out for water vapour is lower after unloading of the wafer 5 for the hot wall situation.

BRIEF DESCRIPTION OF DRAWING FIGURES

FIG. 1 schematically illustrates a sputter etching operation on a patterned wafer 5 having a polymeric insulating layer 14 protecting a subjacent metal layer(s) 12. A plasma (argon in the drawing) is used to sputter the wafer 5 to remove metal oxides (MeO) that have accumulated on exposed contact portions 13 of the metal layer(s) prior to a subsequent step to apply metal contacts 16 and 18 (illustrated schematically in FIG. 2).

FIG. 2 illustrates a sputter-coating operation carried out on the patterned wafer 5 in FIG. 1 after the step illustrated in FIG. 1 has been concluded. In this step, metal contact layers 16 and 18 are applied via sputtering from suitable metal targets.

FIGS. 3-4 schematically illustrate an inductively-coupled plasma etching chamber useful to carry out the sputtering step depicted in FIG. 1 to remove MeO deposits from a wafer 5, at different times during a sputtering operation.

FIGS. 5a-d show residual gas spectra measured within an etching chamber similar to that illustrated in FIGS. 3-4 for a typical etching operation using Ar as the source of plasma.

FIG. 7 shows gas spectra similar to that in FIG. 6 but for a 180-second etching operation.

Figure 4:
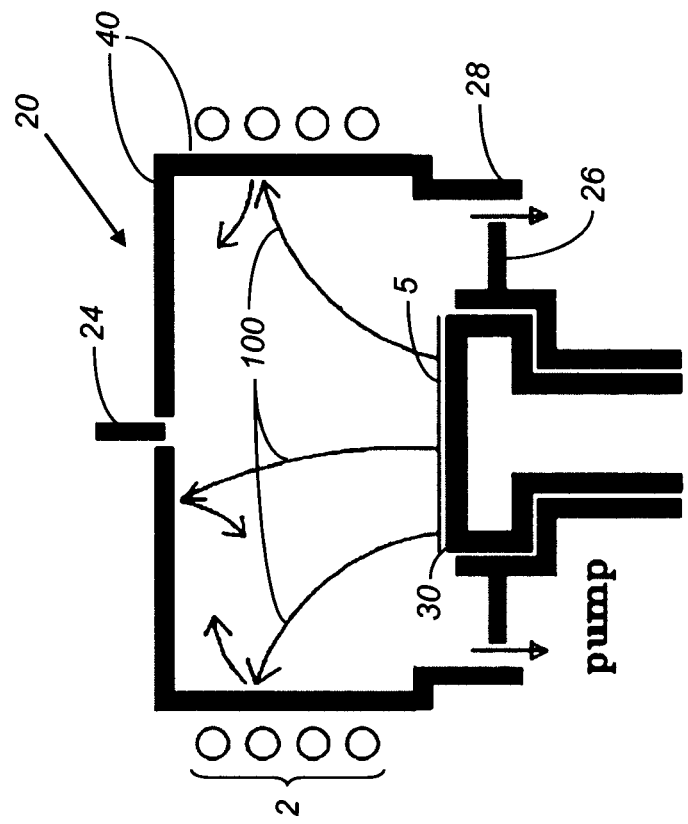
Figure 3:
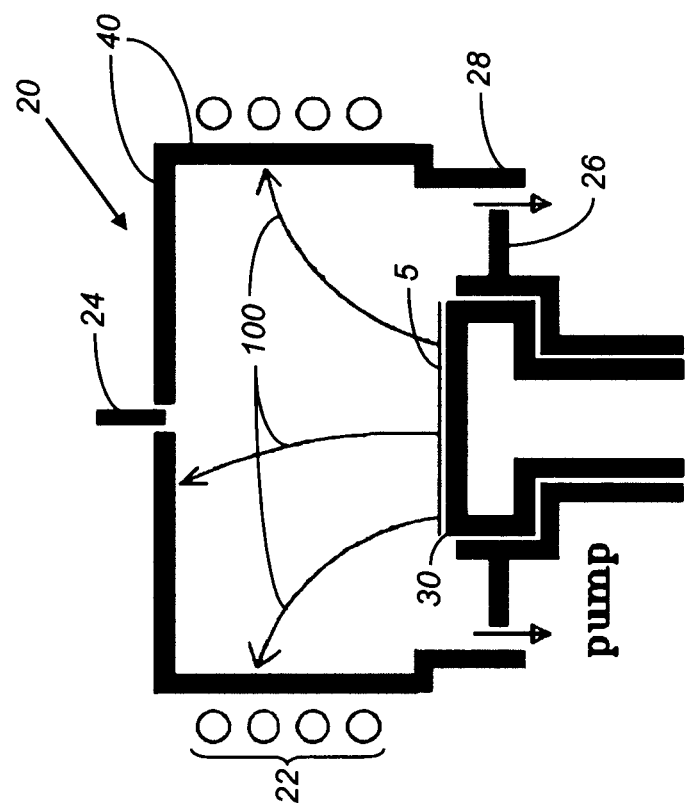
Figure 5A:
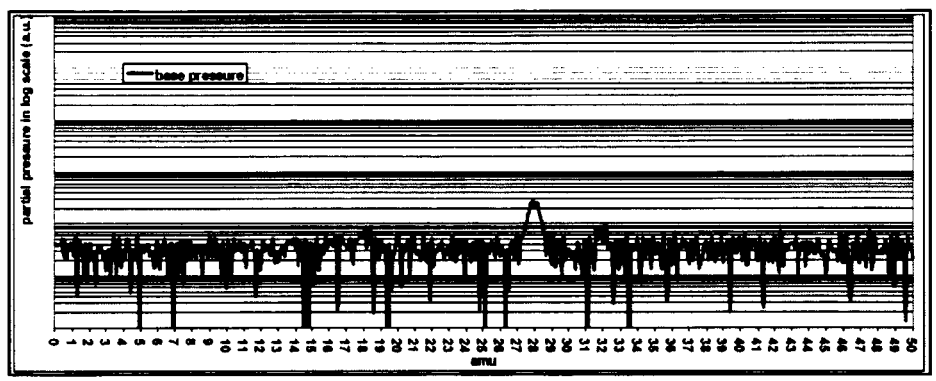
Figure 5B:
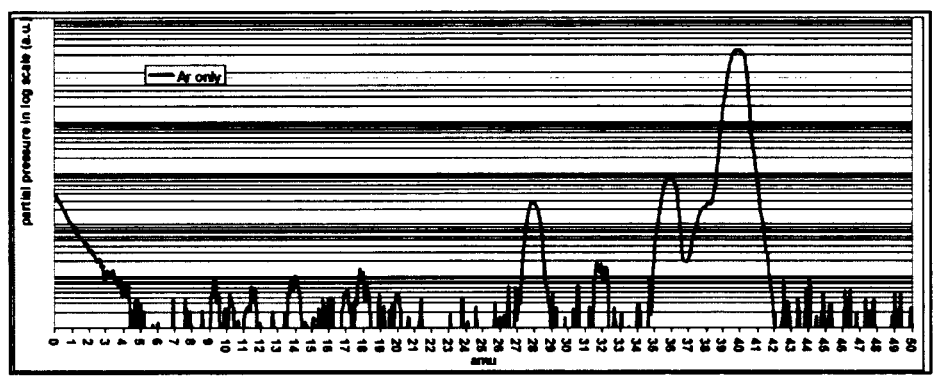
Figure 5C:
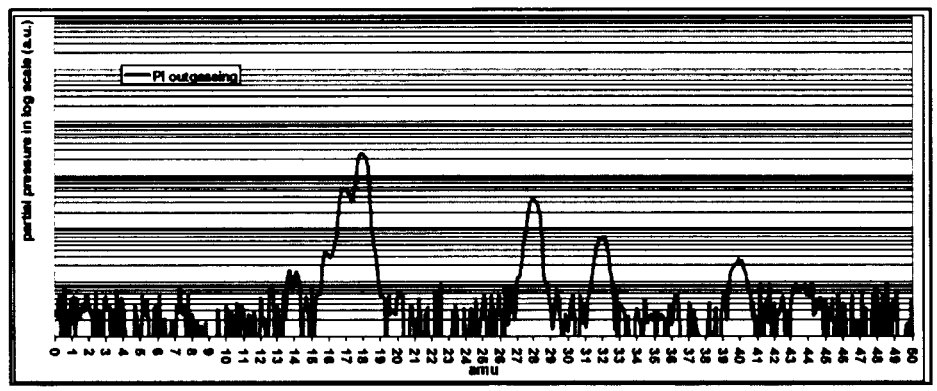
Figure 5D:
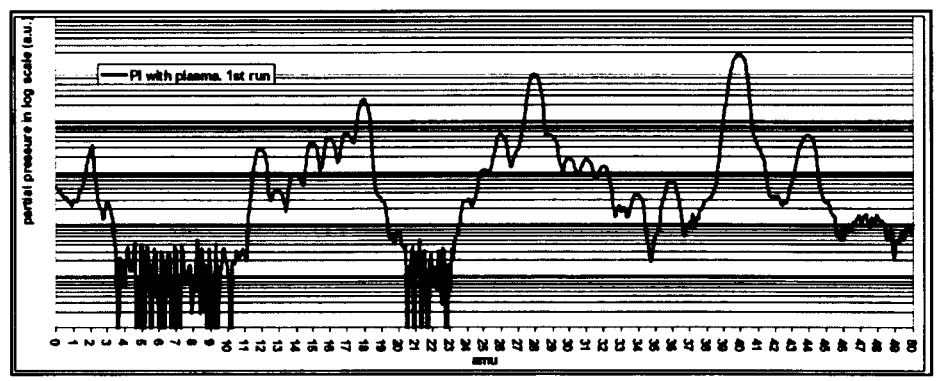

FIG. 8 schematically illustrates an etching chamber as in FIGS. 3-4 above, but having an actively-cooled element positioned adjacent the pedestal at the base of the chamber.

FIGS. 9 and 11-13 schematically illustrate various embodiments of an etching chamber incorporating an actively-cooled element at the base of the etching chamber. In some embodiments, a getter sublimation pump is also incorporated to provide a source of getter material in the etching chamber, which is used in combination with the actively-cooled element to reduce the concentration of contaminant gases, namely VCs and polymer, in the chamber that emanate from the polymeric insulating layer 14 as a result of plasma etching.

Figure 10:
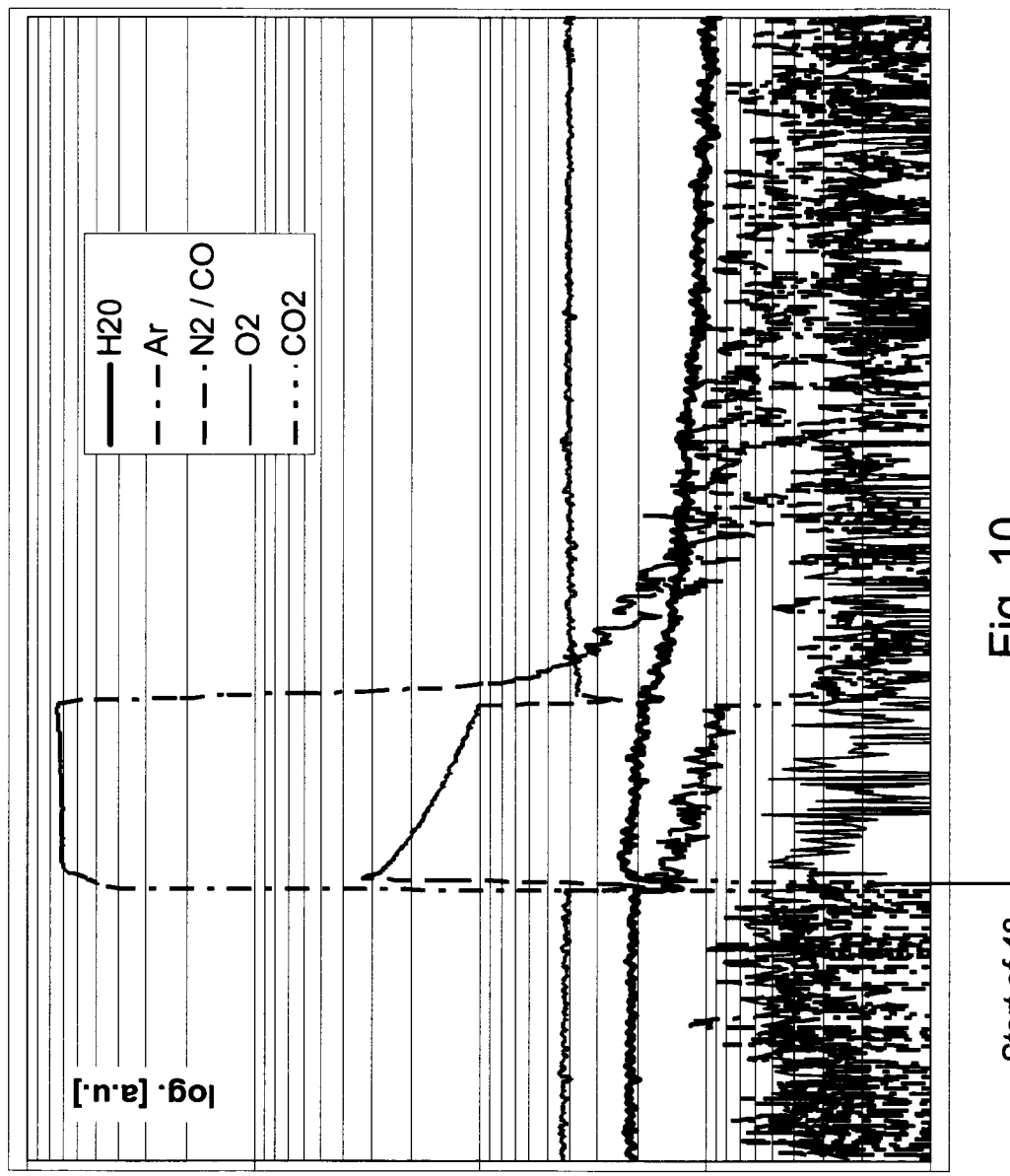

FIG. 10 is a gas spectrum showing the time-dependent residual gas concentrations during an etching operation carried out on a Ti getter substrate to introduce getter material in the etching chamber, which was performed in an etching chamber as illustrated in FIG. 9 as further described below

SUMMARY OF THE INVENTION

Since the residual gas environment plays an important role, a simple model for the amount of VC (including both evolved vapour contaminants and sputtered polymer material) in the process chamber can be formulated as follows:

Accumulation of $VC \sim (D_{SUB} - A_{WALL} + D_{WALL} - P)$ where P is the pump rate, $A_{WALL}$ is the adsorption rate of the wall, $D_{WALL}$ is the desorption rate of the wall and $D_{SUB}$ is the desorption rate of the substrate 5, all with respect to VC. The balance of adsorption and desorption is mainly given by the temperature. In the relation above it is assumed that the source of contaminating VC is the wafer 5 only, driven by the following 3 heat sources:

1. Starting temperature of the wafer as given by the degas process, which is typically not cooled down prior to the etch process,
2. Process heat by the etch process, and
3. Heat up by hot chamber environment via radiation, which depends on the time in operation, the duty cycle of processing and the source (e.g. coil 22) design.

The process heat (item 2 immediately above) is the major contributor to wafer 5 heat up and it cannot be avoided since a certain material removal is required to clean the contact portion 13. Active cooling of the wafer 5 to inhibit the outgassing may be a solution here, but a too extensive cooling will cause any condensable compounds to condense and accumulate on the wafer 5, which may result in even higher contamination and contact resistance problems. Increasing the pumping speed P will result in less VC, however this is limited by the pump installed on the system and by the shields 26 and 28 in FIGS. 3-4, which have the task to protect the chamber from sputter etched material and therefore exhibit a limitation of the pumping speed P.

Accordingly, presently disclosed are methods to reduce VC by the introduction of means to increase the adsorption rate of the wall $A_{WALL}$ in the foregoing relation by improved cooling strategies. Cooling is not always possible in all locations of the chamber, especially not where electromagnetic power is to pass through the housing 20, like when ICP coils (22 in FIGS. 3-4) are used. Cooling of other areas of the walls 40 (e.g. the top wall illustrated in FIGS. 3-4) is possible if sufficiently conductive materials are used for those areas (e.g. for the top wall mentioned above). However the application of very cold surfaces generally bears the danger of uncontrolled release of VC when a certain amount is accumulated on those surfaces. Very cold surfaces also need to be heated up when the system is vented to prevent the adsorption of environmental humidity. These aspects of easy maintenance for shield exchange also need to be taken into account.

Therefore moderate cooling, preferably in the range of −20 to +10° C., is proposed in the following solutions, in particular in combination with a getter pump setup. The present solutions utilize an actively-cooled element positioned in the etching chamber preferably at or near its base adjacent the support surface of pedestal 30 that supports the wafer 5 during use. This position places the cooled element close to the source of the generation of VC and not in the remote area of a pumping port or more distant walls 40 of the chamber. The actively-cooled element is preferably disposed such that during etching it is nearer to the wafer 5 than is any other major surface within the etching chamber (except for the pedestal 30 upon which the wafer 5 will rest). By 'major surface,' it is meant a surface having a non-negligible surface expanse, such as a wall 40 of the chamber or a dark space shield therein; the term does not encompass trivial or small features of negligible surface area relative to such a wall or shield. This position at the base of the chamber also typically provides a convenient area to access the cooled element for maintenance or replacement.

FIG. 8 schematically illustrates an etching chamber enclosed within a housing 20 as in FIGS. 3-4 above, having an actively-cooled element 50 positioned adjacent the pedestal 30 at the base of the chamber. The actively-cooled element 50 shown in FIG. 8 is purely schematic and is not intended to represent the particular structure or location of such an element, except to indicate that it is positioned adjacent the surface of the pedestal 30 at the base of the etching chamber. For example, the cooled element 50 may be a stand-alone element incorporated into the etching chamber, or it may be or form part of one or both of the shields 26 and 28. In a preferred embodiment, the cooled element 50 may be in the form of an annular ring that surrounds and shares a common longitudinal axis with the surface of the pedestal 30, which supports the wafer 5 during etching. In the illustrated embodiment a layer of getter material 52 is deposited on the surface of the cooled element 50. Getter materials are known generally, and preferably a getter material having affinity for both water vapour and $CO/CO_2$ will be selected (e.g. Ti), as these are principal contaminants evolved from the insulating layer 14 via outgassing due to sputtering. The getter material will have a strong affinity for VC vapors in the etching chamber, and will attract those species as indicated by the arrows in FIG. 8, forming stable solid compounds with them that remain adsorbed to the getter-coated surface. That the getter-coated surface is cooled enhances this effect and provides even greater adsorption capacity for VCs.

Broadly, a sputter etching chamber is provided, which includes an inlet for the introduction of ionizable gas, and a support surface located in the chamber. The support surface is adapted to support a wafer to be etched in the chamber. The chamber also includes an actively-cooled element located in the chamber adjacent said pedestal.

Also provided is a method of sputtering that includes the following steps: a) placing a wafer from which it is desired to remove metal oxide deposits onto the support surface in a sputter etching chamber as described in the preceding paragraph; chilling the actively-cooled element to a temperature in the range of −50 to +10° C.; and ionizing an ionizable gas in the chamber to produce a plasma therefrom, wherein the plasma etches the wafer to remove metal oxide deposits; and wherein volatile compounds evolved from the wafer as a result of etching are preferentially adsorbed onto the actively-cooled element as compared to other surfaces in said chamber.

DESCRIPTION OF PREFERRED EMBODIMENTS

FIG. 9 illustrates a first embodiment utilizing an actively-cooled element 50 as summarized above. For clarity, only features located at the base of the etching chamber are illustrated in FIG. 9, with like reference numerals from the preceding figures being used for like features. In the present embodiment, the wafer 5 that is to be etched to remove MeO deposits rests on the pedestal 30 in the etching chamber as described above. The wafer 5 is surrounded by a protection ring 6 made of quartz that is situated on the pedestal 30, which is connected to an RF bias. A dark space shield 26 forms part of the pump channel. A counterpart shield 28 is cooled by housings, e.g. in the form of a coil of tubing 29, in thermal contact with the shield 28. A cooling fluid in the range of −50 to +10° C., preferably in the range of −20 to +10° C., more preferably in the range of −20 to 0° C., circulates through the tubing 29. The tubing is made from a thermally conductive material, such as metal, and preferably from copper to ensure that the actively-cooled shield 28 itself reaches a temperature substantially in the foregoing range(s) based on heat transfer therefrom into the cooling fluid.

During an etching operation, adsorption of VC evolved from the insulating layer 14 on the actively-cooled shield 28 will be thermodynamically favored compared to the other, higher-temperature surfaces in the etching chamber. This effect is further enhanced by its relative proximity to the source of the VC, directly adjacent the wafer 5, representing a shorter distance for the VC to travel to be adsorbed compared to other surfaces that are thermodynamically disfavoured as a result of their elevated temperatures.

In addition to the actively-cooled element 50 (in this embodiment the shield 28), one way to enhance the removal of VC from the chamber space and to improve the conditions in the chamber is to sputter etch a substrate coated or made with Titanium or another getter material, like Ta, Al, Zr, Mo, Nb or V (hereafter referred to as the getter substrate) prior to etching the intended wafer 5 to remove MeO deposits. In this methodology, the getter substrate is first placed in the chamber on the pedestal 30, and the argon plasma is activated and directed at the getter substrate via the bias potential applied to the pedestal. Getter material that is sputtered from the getter substrate will enter the vapour phase and adsorb to the interior surfaces within the chamber, including to the walls 40 of the housing 20, and to each of the shields 26 and 28. Notably, when the actively-cooled shield 28 is cooled during this process, the sputtered getter material will be preferentially adsorbed to the surface of that shield 26 because adsorption to the colder surface (which therefore exhibits a higher-capacity adsorption isotherm for the sputtered material) will be thermodynamically favored. However, the sputtered getter material will also be deposited on the other interior surfaces in the etching chamber. Once the etching step using the getter substrate is completed, the getter substrate can be replaced in the etching chamber by the intended wafer 5 to be etched of MeO deposits. Then the etching operation to remove those deposits proceeds as discussed above. Note that etching the getter substrate to deposit getter material on interior surfaces of the etching chamber can be performed after each wafer 5 is etched to remove MeO deposits, or it can be performed after a plurality of successive wafers 5 are etched. For example, etching of the getter substrate can be performed following every 2, 5, 10, 25 or 50 (or some other number) wafer-etch operations.

Titanium is the preferred getter material due to its high getter capability for water, hydrogen and hydrocarbons and since there will be no interference with the subsequent metallization to produce the contact layer 16 if that layer is to be titanium, which in many cases is used as adhesion contact layer (i.e. the contact layer deposited first directly on the metal layer 12). The Ti getter substrate can therefore even be prepared in a chamber in the same tool.

The getter effect of a Ti getter substrate that was sputtered for 48 seconds in an etching chamber as shown in FIG. 9 is plotted in FIG. 10. In this experiment 12 nm thickness of Ti metal was removed from a substrate having a diameter of 300 mm, corresponding to a total amount of approx. 3 mg of Ti deposited to the walls 40 and other interior surfaces in the chamber. As can be seen from the $H_2O$ signal in FIG. 10, the water vapour level was reduced to less than 50% after the getter step. It is an important question whether the getter material may have an influence on the condition of the etching chamber due to some metal layer deposition. This is especially important since electromagnetic coupling through the dielectric walls 40 may be affected by metal layers. However it was found that the effect on inductive coupling is rather small for thin Ti layers of a few nm only. These metal layers are oxidized on both the lower and the upper interface when they are deposited on the walls having adsorbed water vapour on them and when water vapour coming from the next PI-coated wafer reacts with the freshly deposited metal.

Instead of using a Ti coated getter substrate (or one made of titanium), the pedestal 30 itself can be coated with or made from a pure metal (such as Ti) useful as a getter material, which can be used for chamber conditioning. In this embodiment the pedestal 30 (sometimes referred to as a chuck) itself can act as a sublimation getter device if the RF and bias potential are activated to etch the pedestal 30 surface directly, for example in between successive (or a selected plurality of successive) etching operations for successive wafers 5. This will sputter getter material, such as Ti, directly from the pedestal surface. The sputtered getter material will then be deposited on the interior surfaces of the etching chamber where it will enhance the adsorption of VC contaminants that are evolved from the insulating layer 14 in the ensuing sputter operation to remove MeO deposits. In this manner, the etching chamber can be reconditioned for short periods in between sputtering of successive wafers 5 without the need to provide a separate getter substrate in the chamber, which will reduce throughput and cycle times.

In this embodiment preferably the pedestal 30 material is selected so as not to interfere with subsequent contact-layer 16 deposition, or to present an impediment to said deposition. Again, the pedestal/chuck material can be selected to correspond to the material of the adhesion contact layer to eliminate this concern. This embodiment may be preferable to a separate getter substrate sputtering operation because it will completely eliminate the extra step, resulting in shorter idle times of the etching chamber.

In a further embodiment illustrated in FIG. 11, an additional sublimation getter device is provided in the etching chamber. In the simplest case a single-turn resistively-heated wire 35 that can be resistively-heated via an applied current is used as the additional sublimation getter device. Such a wire 35 can be wound around the wafer position (e.g. circumferentially around and concentric with the support surface of the pedestal 30) and connected to a current source to apply a current for heating the wire, and it can be protected by concentric shields 26 and 28. This wire can principally be made of any getter material, but a composition of nominally 85% Titanium and 15% Molybdenum (mass basis, negligible or trace impurities) is preferred for resistive heating. The Titanium is evaporated by applying a current and thereby resistively-heating the wire, and condensed to the cooled shield 28 binding water vapour, hydrogen and hydrocarbons liberated from the insulating layer 14 as VC. In an etching chamber for 300 mm wafers this wire 35 can be arranged on a diameter of 400 mm around the wafer 5 (i.e. around the support surface of the pedestal 30), giving a total length of 1250 mm for the wire. A wire of 2 mm diameter may be run at a current of 50 A at a voltage of 40V to evaporate titanium getter material.

Figure 6:
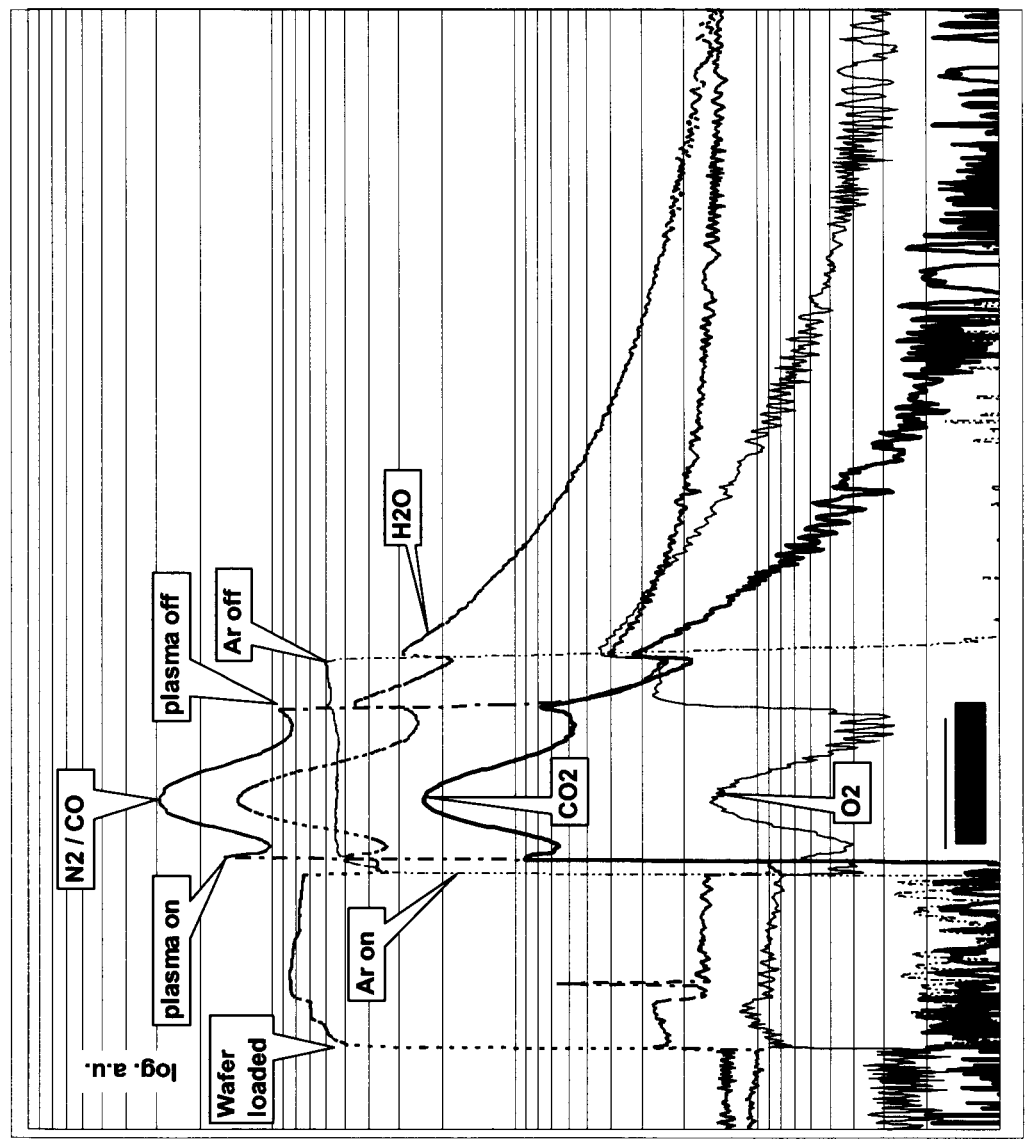
FIG. 6 shows gas spectra for gases in an etching chamber similar to that illustrated in FIGS. 3-4 during a 48-second etching operation to illustrate the time-dependent behaviour of gas concentration.

In essence, the wire 35 operates as an on-demand getter sublimation pump. During an etching operation, the wire 35 is not etched because it is not on negative potential and is shielded by the shield 28 as seen schematically in FIG. 11. So carrying out an etching operation with the Ar plasma does not result in liberating getter material. Instead, an advantage of the Ti sublimation pump in this application is that it can be applied only when needed. This means that the resistance heater (wire 35) is preferably only turned on when the etching process is running and according to the expected load of VC, which is time dependent as shown in FIGS. 6-7. By generating or referring to an appropriate time-dependent VC-profile for the specific etching operation being performed, the liberation of getter material can be tuned or programmed to the specific application demand. For example, the wire 35 current can be used as a programmable parameter to be set in time and intensity based on the application-specific VC-time profile. Alternatively the sublimation heater (wire 35) can be turned on when a wafer 5 has been unloaded to prepare for a low level of contamination before the next wafer is loaded.

In still a further embodiment illustrated in FIG. 12, the pedestal 30 is made of a getter material such as titanium similarly as in the embodiment discussed above in connection with FIG. 9. However, in this embodiment the pedestal includes a perimeter area 8 of its upper surface that extends radially outward from the protection ring 6 surrounding the wafer 5, which perimeter area 8 is unprotected by any dark space shield and therefore is open to plasma sputtering during the sputtering operation to remove MeO deposits from wafer 5. In this embodiment, the etching chamber is continuously conditioned by sputtering titanium or other getter material from the pedestal itself whenever the plasma and RF bias connected to the pedestal are active—i.e. during the sputtering operation for the wafer 5. The sputter surface may be directed upwards as for the perimeter area 8 in FIG. 12, or in a radial direction. An advantage of this setup is that it is very simple. One disadvantage, however, is that the amount of getter material that is evaporated from the pedestal 30 cannot be independently adjusted during a sputtering operation to remove MeO deposits from a wafer 5 because the perimeter area 8 of the pedestal is constantly exposed to the sputter plasma.

FIG. 13 illustrates yet a further embodiment wherein the pedestal 30 (or at least an upper portion thereof or the upper portion of its perimeter wall 32) is made from or coated with a getter material, such as titanium. In this embodiment, the dark space shield 26 that shields the perimeter wall of the pedestal 30 is shortened relative to the height of the pedestal, thereby exposing an upper terminal portion of the pedestal's perimeter wall 32. With this portion of the pedestal's perimeter wall exposed to plasma during an etching operation, the plasma will sputter getter material from this portion of the perimeter wall 32. In principle in the illustrated embodiment the getter material is sputtered from the upper portion of the perimeter wall 32 in a radial direction towards the cooled shield 28,50 as indicated by the arrows in FIG. 13. One advantage of this embodiment is that contamination of the wafer 5 by getter material is avoided by the protection ring 6, which should be a larger in diameter than the pedestal 30.

Although the invention has been described with respect to certain preferred embodiments, it is to be understood that the invention is not limited by the embodiments herein disclosed, which are exemplary and not limiting in nature, but is to include all modifications and adaptations thereto as would occur to the person having ordinary skill in the art upon reviewing the present disclosure, and as fall within the spirit and the scope of the invention as set forth in the appended claims.

What is claimed is:

1. A method of sputtering comprising:
   a) placing a wafer from which it is desired to remove metal oxide deposits on a support surface in a sputter etching chamber comprising an inlet for the introduction of ionizable gas, wherein the support surface located in said chamber is adapted to support the wafer to be etched in the chamber, and an actively-cooled element is located in the chamber adjacent said support surface;
   b) chilling said actively-cooled element to a temperature in the range of −50 to +10° C.; and
   c) ionizing an ionizable gas in said chamber to produce a plasma therefrom, said plasma etching said wafer to remove metal oxide deposits;
   wherein volatile compounds evolved from said wafer as a result of said etching are preferentially adsorbed onto said actively-cooled element as compared to other surfaces in said chamber,
   wherein said actively-cooled element comprises a dark space shield located at a base of said sputter etching chamber,
   wherein the etching chamber further comprises a getter sublimation pump located in said chamber, and wherein the etching chamber further comprises a layer of getter material deposited on a surface of said actively-cooled element.

2. The method of claim 1, said temperature being in the range of −20 to +10° C.

3. The method of claim 1, said temperature being in the range of −20 to 0° C.

4. The method of claim 1, said actively-cooled element is located adjacent the support surface of a pedestal at a base of said chamber.

5. The method of claim 1, wherein the getter sublimation pump comprises a getter material, and said method further comprising:
   d) sputtering said getter sublimation pump to evaporate the getter material therefrom and deposit the same on said actively-cooled element.

6. The method of claim 5, comprising carrying out said steps (a) through (c) to remove metal oxide deposits from one wafer, thereafter removing said one wafer from said etching chamber, thereafter carrying out step (d) with no wafer in said etching chamber, and thereafter inserting a further wafer in said etching chamber and carrying out steps (a) through (c) on said further wafer.

7. The method of claim 5, comprising repeating said steps (a) through (c) to remove metal oxide deposits from a first plurality of successive wafers, thereafter carrying out step (d) with no wafer in said etching chamber, and thereafter again repeating said steps (a) through (c) to remove metal oxide deposits from a further plurality of successive wafers.

8. The method of claim 1, wherein the getter sublimation pump comprises a resistively-heated wire comprising the getter material, and said method further comprising energizing said wire to evaporate getter material therefrom during step (c).

9. The method of claim 8, said wire being energized to evaporate getter material therefrom during step (c) on-demand based on a time-dependent profile for evolution of volatile compounds from said wafer during etching.

10. The method of claim 1, comprising carrying out said steps (a) through (c) to remove metal oxide deposits from one wafer, thereafter removing said one wafer from said etching chamber, thereafter inserting a getter substrate that comprises or is coated with a getter material, thereafter plasma etching said getter substrate to remove getter material therefrom to be deposited on interior surfaces in said etching chamber, and thereafter inserting a further wafer in said etching chamber and carrying out steps (a) through (c) on said further wafer.

11. The method of claim 1, comprising repeating said steps (a) through (c) to remove metal oxide deposits from a first plurality of successive wafers, thereafter inserting in said etching chamber a getter substrate that comprises or is coated with a getter material, thereafter plasma etching said getter substrate to remove getter material therefrom to be deposited on interior surfaces in said etching chamber, thereafter removing said getter substrate from said etching chamber, and thereafter again repeating said steps (a) through (c) to remove metal oxide deposits from a second plurality of successive wafers.

12. The method of claim 1, said support surface having an exposed perimeter area that extends radially outward from said wafer resting thereon during step (c), said perimeter area comprising getter material, wherein plasma sputtering during step (c) removes getter material from said perimeter area of said support surface, which is deposited onto other surfaces within said chamber.

13. A method of sputtering comprising:
 a) placing a wafer from which it is desired to remove metal oxide deposits on a support surface in a sputter etching chamber comprising an inlet for the introduction of ionizable gas, wherein the support surface located in said chamber is adapted to support a wafer to be etched in the chamber, and an actively-cooled element is located in the chamber adjacent said support surface;
 b) chilling said actively-cooled element to a temperature in the range of −50 to +10° C.; and
 c) ionizing an ionizable gas in said chamber to produce a plasma therefrom, said plasma etching said wafer to remove metal oxide deposits;
 wherein volatile compounds evolved from said wafer as a result of said etching are preferentially adsorbed onto said actively-cooled element as compared to other surfaces in said chamber,
 wherein said actively-cooled element comprises a dark space shield located at a base of said sputter etching chamber,
 wherein the sputter etching chamber further comprises a pedestal disposed at least partially within said chamber, said support surface being a surface of said pedestal, said getter sublimation pump comprising at least a portion of said pedestal made from or coated with a getter material.

14. The method of sputtering according to claim 1, wherein the dark space shield comprises a portion of a pump channel.

* * * * *